(12) United States Patent
Redd

(10) Patent No.: US 6,780,703 B2
(45) Date of Patent: Aug. 24, 2004

(54) METHOD FOR FORMING A SEMICONDUCTOR DEVICE

(75) Inventor: Randy D. Redd, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/228,711

(22) Filed: Aug. 27, 2002

(65) Prior Publication Data

US 2004/0043548 A1 Mar. 4, 2004

(51) Int. Cl.[7] .............. H01L 21/8234; H01L 21/8244; H01L 21/00
(52) U.S. Cl. .............................. 438/238; 43/37; 43/31
(58) Field of Search .................. 438/179, 238, 438/37, 455, 31, 285, 604, 197

(56) References Cited

U.S. PATENT DOCUMENTS

| | | | |
|---|---|---|---|
| 5,508,539 A | | 4/1996 | Gilbert et al. |
| 5,821,170 A | | 10/1998 | Klingbeil, Jr. et al. |
| 6,033,995 A | | 3/2000 | Muller |
| 6,076,585 A | | 6/2000 | Klingbeil, Jr. et al. |
| 6,091,111 A | * | 7/2000 | Demirlioglu et al. ........ 257/344 |
| 6,372,356 B1 | * | 4/2002 | Thornton et al. ............ 438/604 |
| 6,399,997 B1 | * | 6/2002 | Lin et al. ..................... 438/238 |
| 6,426,248 B2 | * | 7/2002 | Francis et al. .............. 438/197 |
| 6,462,360 B1 | * | 10/2002 | Higgins et al. .............. 438/285 |
| 6,534,382 B1 | * | 3/2003 | Sakaguchi et al. .......... 438/455 |
| 6,558,973 B2 | * | 5/2003 | Johnson et al. ................ 438/37 |
| 6,563,118 B2 | * | 5/2003 | Ooms et al. .............. 250/338.3 |
| 6,583,455 B1 | * | 6/2003 | Micovic et al. ............. 257/200 |
| 6,594,414 B2 | * | 7/2003 | Tungare et al. ................ 438/31 |

* cited by examiner

Primary Examiner—John F. Niebling
Assistant Examiner—Walter L. Lindsay, Jr.
(74) Attorney, Agent, or Firm—Robert A. Rodriguez

(57) ABSTRACT

An etch stop layer (12) is formed over a semiconductor substrate (10). An epitaxial layer (14) is formed overlying the etch stop layer (12). The combination of the epitaxial layer (14), etch stop layer (12), and semiconductor substrate (10) form a composite substrate (16). The composite substrate (16) is processed to fabricate a semiconductor device (21) over the epitaxial layer (14). Then the composite substrate (16) is mounted to a wafer carrier (32) to expose the semiconductor substrate (10) and the semiconductor substrate (10) is removed to substantially define a semiconductor device substrate (50) that comprises the epitaxial layer (14).

16 Claims, 2 Drawing Sheets

METHOD FOR FORMING A SEMICONDUCTOR DEVICE

FIELD OF THE INVENTION

The present invention relates generally to semiconductor manufacturing and more particularly to a method for thinning a semiconductor substrate.

BACKGROUND OF THE INVENTION

Semiconductor devices made from gallium arsenide (GaAs) substrates are capable of increased performance over those made from silicon substrates. GaAs has a larger low-field electron mobility and a lower saturation field than silicon; and GaAs can be made semi-insulating, which reduces parasitic capacitance. All of which mean an increase in speed as compared to silicon.

However, compared to silicon, Gallium arsenide is a poor thermal conductor. This limits the number of integrated circuits that can be fabricated on a given area of semiconductor material and limits the power capability of the semiconductor device. To improve thermal conductivity, GaAs device substrates are typically thinned. This involves mechanically grinding away bottom portions of the gallium arsenide substrate after forming the semiconductor device. The grinding process can cause problems with substrate breakage, and the performance variations associated with grinding result in considerable within-wafer and wafer-to-wafer thickness variations. Conventional grinding processes can thin GaAs substrates to target thicknesses of approximately 25 microns and are capable of achieving uniformities of +/-13 microns across the wafer (i.e., for a substrate having a target thickness of 25 microns after grinding, the thickness across the substrate can range from approximately 12–38 microns). Additional thinning of the wafer substrate to accommodate increased thermal conductivity and power requirements will ultimately require wafer thinning processes that have improved uniformity and are less susceptible to breakage.

DETAILED DESCRIPTION OF THE DRAWINGS

The features and advantages of the present invention will be more clearly understood from the following detailed description taken in conjunction with the accompanying figures where like numerals refer to like and corresponding parts and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The present invention discloses a method for thinning a semiconductor substrate. In one embodiment, an etch stop layer is formed over a semiconductor substrate and an epitaxial semiconductor layer is formed over the etch stop layer. The combination of the semiconductor substrate, etch stop layer, and epitaxial layer form a composite substrate that is used to fabricate semiconductor devices. The thickness of the epitaxial layer corresponds approximately to the desired thickness of a functional semiconductor device substrate.

After forming the epitaxial layer, the composite substrate is processed through a manufacturing process to fabricate semiconductor devices and associated circuitry in and on the epitaxial layer. The composite substrate is mounted to a wafer carrier and the semiconductor substrate portion of the composite substrate is removed via a chemical (wet or plasma) process or a combination of mechanical and chemical processes. Removing the semiconductor substrate portion defines a thinned semiconductor device substrate that comprises the epitaxial layer. The final thickness and uniformity of the semiconductor device substrate is controlled using the etch stop and epitaxial layers. Embodiments of the present invention will now be disclosed in greater detail in reference to the accompanying figures.

Figure 1:
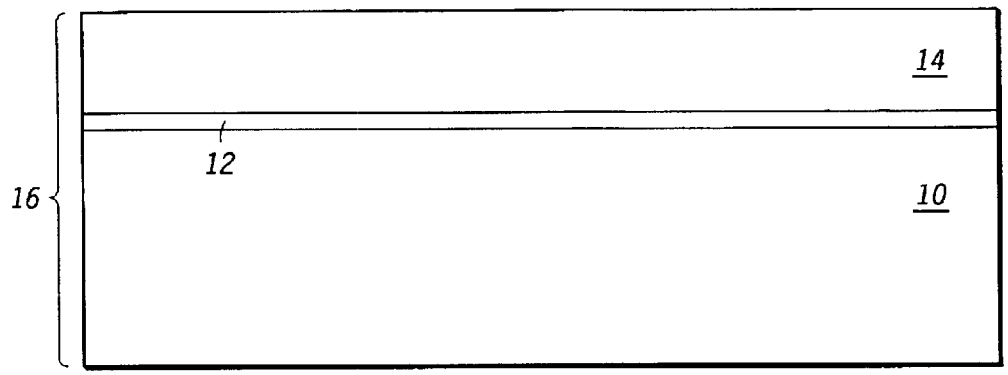
FIG. 1 is a cross-sectional view illustrating a semiconductor substrate, that includes an etch stop layer and an epitaxial layer formed over the semiconductor substrate.

Shown in FIG. 1 is an illustration of a cross-sectional view of a semiconductor device substrate 10, an etch stop layer 12 (intermediate layer), and an epitaxial layer 14. In accordance with one embodiment, the semiconductor substrate is a GaAs monocrystalline semiconductor substrate. Alternatively, in other embodiments the semiconductor substrate can include other semiconductor substrate materials such as gallium phosphide (GaP), silicon carbide (SiC), gallium nitride (GaN), indium phosphide (InP), silicon germanium (SiGe), and silicon (Si).

In accordance with one embodiment, the etch stop layer 12 is a layer of aluminum arsenide. Alternatively, etch stop layer 12 may include other materials capable of functioning as an etch stop. Examples of such materials include indium gallium phosphide (InGaP), indium gallium aluminum phosphide (InGaAlP), and the like. In accordance with one embodiment the etch stop layer is deposited in an epitaxial deposition reactor which is used to subsequently deposit the epitaxial layer 14. The thickness of the etch stop layer can range from approximately 10 to 250 nanometers. More typically, the thickness of the etch stop layer is in a range of 15 to 25 nanometers.

Formed overlying etch stop layer 12 is epitaxial layer 14. In accordance with one embodiment the epitaxial layer 14 is a layer of gallium arsenide. The epitaxial gallium arsenide layer 14 is typically deposited to a thickness that is less than 50 microns and preferably to a thickness that is in a range of approximately 5–20 microns. The thickness and uniformity of the epitaxial layer 14 will be an important factor with respect to the final thickness and uniformity of the substrate used in packaged semiconductor device. Additionally, although disclosed in a preferred range of 5 to 25 microns, one of ordinary skill in the art recognizes that in determining the thickness of the epitaxial layer 14 a number of factors should be taken into consideration, such as for example the semiconductor device power requirements and the heat conductivity of the semiconductor device substrate material. In alternative embodiments, the epitaxial layer 14 can include other materials such as those described previously with respect to the semiconductor substrate 10.

In accordance with one embodiment the aluminum arsenide etch stop layer 12 and the gallium arsenide epitaxial layer 14 are deposited in a single epitaxial deposition tool during a single evacuation cycle. While the present discussion is limited to the growth of a single etch stop layer 12 and a single gallium arsenide epitaxial layer 14, one of ordinary skill recognizes that other epitaxial layers, such as indium gallium arsenide, aluminum gallium arsenide, and the like can be formed over the gallium arsenide layer at this time depending on the type and design of the semiconductor device being fabricated. The combination of the semiconductor substrate 10, the etch stop layer 12, and the epitaxial layer 14 form a composite substrate 16.

Figure 2:
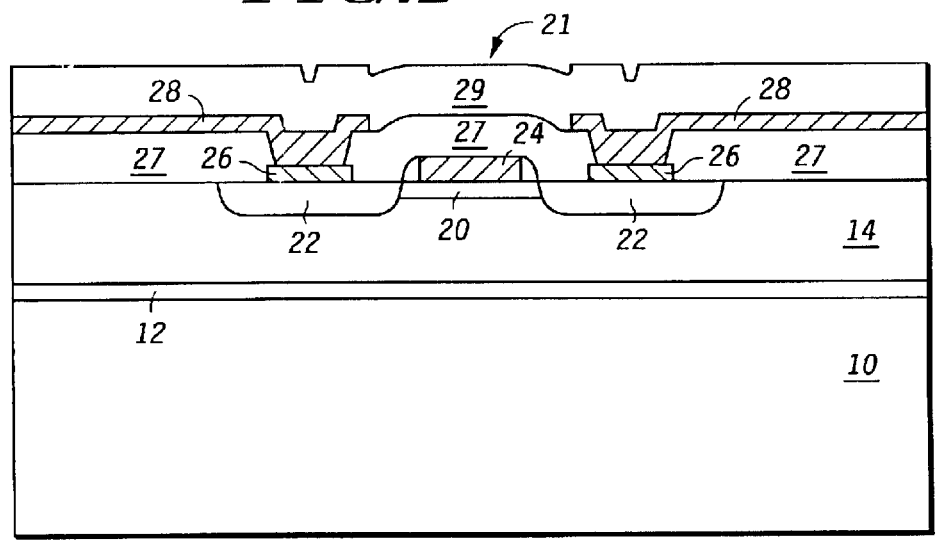
FIG. 2 is a cross-sectional view of the semiconductor substrate of FIG. 1, further illustrating a semiconductor device formed over the epitaxial layer.

Referring now to FIG. 2, a semiconductor device 21 has been formed overlying the epitaxial layer 14 portion of the composite substrate 16. In one non-limiting embodiment, the semiconductor device 21 is a metal semiconductor field effect transistor (MESFET). For example, the semiconductor device 21 may be an N-channel depletion MESFET that includes channel region 20, gate 24, doped source and drain regions 22, source and drain electrodes 26, an interlevel dielectric layer 27, interconnects 28, and a passivation layer 29. The MESFET shown in FIG. 2 can be fabricated using a variety of semiconductor fabrication techniques known to one of ordinary skill. In addition, although the present invention is disclosed in reference to a MESFET, one of ordinary skill in the art recognizes that other types of semiconductor devices such as metal oxide semiconductor field effect transistors (MOSFET) can alternatively be fabricated over the epitaxial layer 14.

Figure 3:
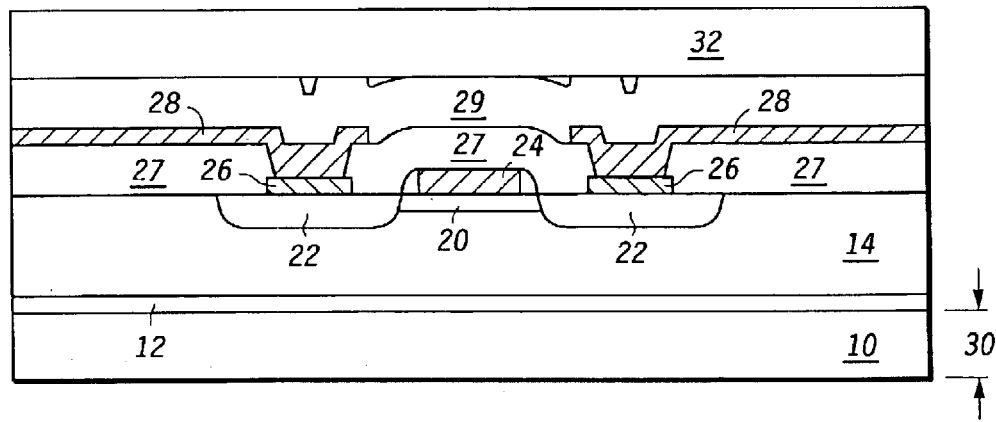
FIG. 3 is a cross-sectional view of the semiconductor substrate of FIG. 2, further illustrating a wafer carrier attached to the semiconductor substrate.

Turning now to FIG. 3, the semiconductor device shown in FIG. 2 has been mounted to a wafer carrier 32 using adhesives and processes known to one of ordinary skill. The wafer carrier supports the wafer during subsequent processing, including removal of portions of semiconductor substrate 10. In one specific embodiment, the wafer carrier is a sapphire wafer carrier that has been mounted to the composite substrate 16 using an adhesive medium such as wax, resist, double-faced tape, or the like.

After attaching the composite substrate 16 to the wafer carrier, the semiconductor substrate 10 is thinned using a bulk-thickness removal process. In accordance with one embodiment, a conventional mechanical grinding process is used to remove the bulk-thickness of the semiconductor substrate 10. In one specific embodiment, a Strausbaugh Model 7AF Backgrinder can be used to remove portions of the semiconductor substrate 10 until the remaining thickness 30 of the semiconductor substrate 10 is in a range of 20 to 50 microns. In alternative embodiments, other methods, such as wet chemical etching or plasma etching, may be used to remove the bulk semiconductor substrate portion. However, throughput and cost considerations generally dictate that grinding is the preferred technique for performing the bulk-thickness removal step.

Figure 4:
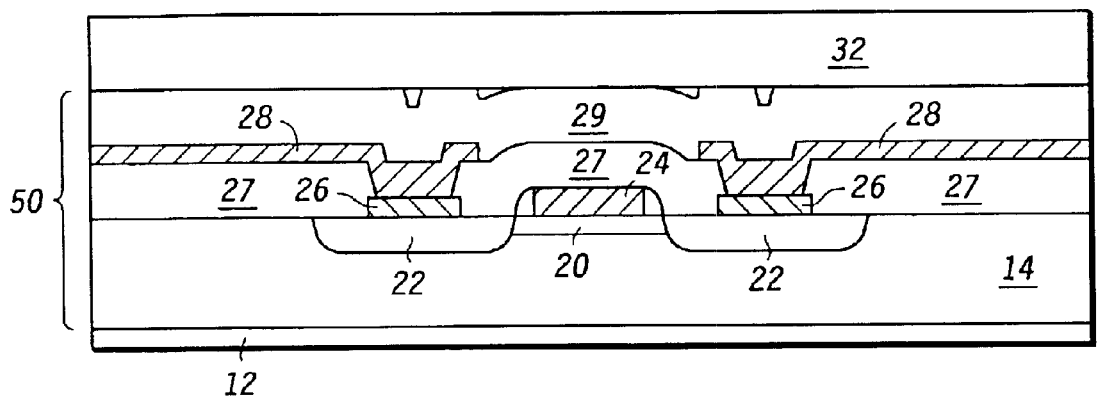
FIG. 4 is a cross-sectional view of the semiconductor substrate of FIG. 3, after removing the semiconductor substrate to substantially define a semiconductor device substrate in accordance with an embodiment of the present invention.

Referring now to FIG. 4, the remaining portions 30 of the semiconductor substrate 10 shown in FIG. 3 are removed using a wet or plasma etch process that exhibits high selectivity with respect to the etch stop layer 12. In one specific embodiment the remaining portions 30 of the semiconductor substrate 10 are exposed to a wet chemical solution consisting of an oxidizing acid such as sulfuric peroxide, citric peroxide, or the like. In a preferred embodiment a plurality of composite substrates, each attached to a sapphire wafer carrier, are batch processed in a Spray Acid Tool manufactured by Semitool, Inc. during which they are sprayed with a sulfuric peroxide solution for a period of time sufficient to remove the remaining portions of the semiconductor substrate 30.

The etch in the oxidizing acid is a self-limiting reaction that removes the remaining portions 30 of the semiconductor substrate. Upon exposure of the aluminum arsenide etch stop layer 12, the oxidizing acid reacts with the aluminum in the aluminum arsenide to form aluminum oxide, which is not etched by the oxidizing acid. Etching terminates when the portions of the semiconductor substrate 10 are completely removed and the exposed aluminum arsenide surface is covered with aluminum oxide. The sapphire carrier protects the epitaxial layer 14 during the etching process. In alternative embodiments, other processes such as single and multiple wafer bath processes or plasma etch processes can also be used to remove the remaining portions of the semiconductor substrate 30.

The removal of the remaining portions of the semiconductor substrate portion 30 substantially defines the semiconductor device substrate 50 for use with the MESFET shown in FIG. 4. If so desired, the semiconductor device substrate can then optionally be processed to remove the etch stop layer 12. Typically, the etch stop layer is sufficiently thin, and its removal for the purposes of improving thermal conductivity may be unnecessary. However, if so desired, an etch stop layer formed of aluminum arsenide can be removed using a 20:1 Ammonium Fluoride HF buffered oxide etch.

Figure 5:
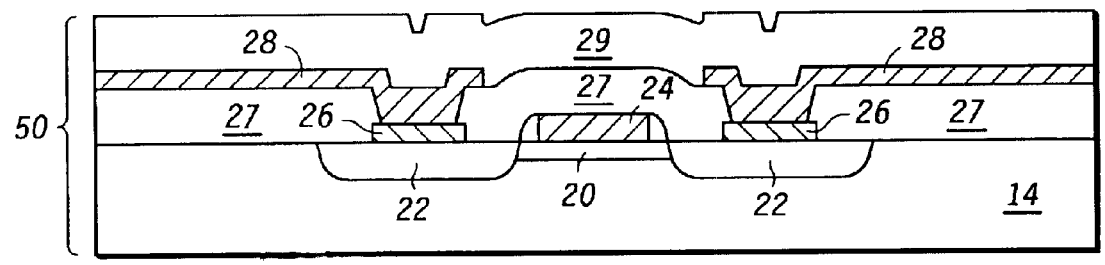
FIG. 5 is a cross-sectional view of the semiconductor substrate of FIG. 4, after removing the wafer carrier.

Shown in FIG. 5, is an illustration of the semiconductor device substrate 50 shown in FIG. 4 after removing wafer carrier 32. In a preferred embodiment, the carrier and substrate are separated from the wafer carrier using the process and apparatus disclosed in U.S. Pat. No. 6,076,585 assigned to the assignee hereof and hereby incorporated by reference. After the wafer carrier 32 and semiconductor device substrate 50 are separated, the semiconductor device substrate 50 is dump rinsed in a deionized water bath and then dried in an isopropyl alcohol vapor dryer. At this point in the process, the semiconductor device substrate 50 is now ready to be processed through subsequent processing operations such as tape and dicing operations (saw, die separation, and die attach).

The present invention is advantageous over prior art methods for thinning semiconductor substrates for a number of reasons. First, the epitaxial semiconductor film can be deposited in a highly controlled manner. This means that thinner semiconductor device substrates can be fabricated with greater uniformity than was previously possible using prior art methods. Unlike the prior art grinding method, which is inherently less uniform—typically only capable of producing uniformities of +/−13 microns across the wafer— the present invention can be used to fabricate semiconductor device substrates that have thicknesses and uniformities that are constrained only by the thickness and uniformity capabilities of the epitaxial layer deposition process. Thus, for example, an epitaxial deposition process used to deposit a 10-micron thick epitaxial layer having a 5% percent thickness variation across the wafer (non-uniformity) would have a thickness variation across the wafer of only approximately 0.5 microns (as opposed to prior art grinding methods which have thickness variation across the wafer on the order of 26 microns (+/−13 microns)). This translates not only to the ability to fabricate even higher power semiconductor devices as compared to the prior art, but also to the ability to fabricate these devices with reduced performance variability attributable to within wafer thickness variations. In addition, there is less likelihood of substrate breakage because mechanical grinding is limited to removing only the initial bulk thickness of the semiconductor substrate. During the latter part of the process, when the wafer is thinnest and most susceptible to breakage wet chemical or plasma etch process is used to thin the composite substrate to its final thickness. The chemical or plasma etch process is less stressful in terms of exerting physical forces on the substrate as compared to the prior art.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for forming a semiconductor device comprising:

forming an intermediate layer over a semiconductor substrate;

forming an epitaxial layer over the intermediate layer;

forming a semiconductor device over the epitaxial layer; and removing the semiconductor substrate to expose the intermediate layer, thereby forming a semiconductor device substrate from remaining portions of the epitaxial layer, wherein the semiconductor substrate is farther characterized as a gallium arsenide semiconductor substrate.

2. The method of claim 1, further comprising removing the intermediate layer after removing the semiconductor substrate.

3. The method of claim 1, further comprising separating the semiconductor substrate into individual die and packaging a die within a semiconductor device package.

4. The method of claim 1, wherein removing the semiconductor substrate further comprises chemically etching the semiconductor substrate.

5. The method of claim 4 further comprising mechanically grinding the semiconductor substrate to remove a portion of the semiconductor substrate before chemically etching the semiconductor substrate.

6. The method of claim 1, wherein the intermediate layer is further characterized as a layer of aluminum arsenide.

7. The method of claim 6, wherein the epitaxial layer comprises gallium arsenide.

8. The method of claim 7, wherein the semiconductor device is a MESFET.

9. The method of claim 7, wherein a thickness of the epitaxial layer is less than approximately 25 microns.

10. The method of claim 7, wherein a thickness of the epitaxial layer is in a range of approximately 5–15 microns.

11. The method of claim 7, wherein a thickness of the epitaxial layer is less than 10 microns.

12. The method of claim 1, wherein a thickness variation of the epitaxial layer is less than 0.5 micron.

13. A method for forming a semiconductor device comprising:

forming an etch stop layer over a gallium arsenide semiconductor substrate;

forming an epitaxial gallium arsenide layer over the etch stop layer;

forming a semiconductor device over the epitaxial gallium arsenide layer;

mounting a surface opposite the gallium arsenide semiconductor substrate to a wafer carrier;

removing portions of the gallium arsenide semiconductor substrate to expose the etch stop layer, wherein removing is further characterized as:
   grinding to remove a bulk portion of the gallium arsenide semiconductor substrate; and
   wet etching to remove a remaining portion of the gallium arsenide semiconductor substrate; and
   removing the wafer carrier.

14. The method of claim 13, wherein die etch stop layer is a layer of epitaxial aluminum arsenide.

15. The method of claim 13 wherein the epitaxial gallium arsenide layer thickness is in a range of approximately 5–20 microns.

16. The method of claim 13 wherein wet etching includes using an acidic solution selected from the group consisting of sulfuric peroxide and citric peroxide.

* * * * *

UNITED STATES PATENT AND TRADEMARK OFFICE
CERTIFICATE OF CORRECTION

| | | |
|---|---|---|
| PATENT NO. | : 6,780,703 B2 | Page 1 of 1 |
| APPLICATION NO. | : 10/228711 | |
| DATED | : August 24, 2004 | |
| INVENTOR(S) | : Randy D. Redd | |

It is certified that error appears in the above-identified patent and that said Letters Patent is hereby corrected as shown below:

In Column 5, Line 40, Claim No. 1:

Change "farther" to --further--

In Column 6, Line 41, Claim No. 14:

Change "die" to --the--

Signed and Sealed this

Fourteenth Day of November, 2006

JON W. DUDAS
*Director of the United States Patent and Trademark Office*